US012615032B2

(12) United States Patent 　(10) Patent No.:　US 12,615,032 B2
Guo 　(45) Date of Patent: 　Apr. 28, 2026

(54) QUARTZ RESONATOR

(71) Applicant: TXC Corporation, Taipei City (TW)

(72) Inventor: Bing-Jyun Guo, Taipei City (TW)

(73) Assignee: TXC Corporation, Taipei City (TW)

( * ) Notice: Subject to any disclaimer, the term of this patent is extended or adjusted under 35 U.S.C. 154(b) by 0 days.

(21) Appl. No.: 18/934,249

(22) Filed: Nov. 1, 2024

(65) Prior Publication Data

US 2026/0106597 A1　Apr. 16, 2026

(30) Foreign Application Priority Data

Oct. 15, 2024　(TW) ................................. 113139207

(51) Int. Cl.
H03H 9/19 　(2006.01)
G01K 7/22 　(2006.01)
H03B 5/32 　(2006.01)

(52) U.S. Cl.
CPC ................. H03H 9/19 (2013.01); G01K 7/22 (2013.01); H03B 5/32 (2013.01)

(58) Field of Classification Search
CPC ............... H03H 9/19; G01K 7/22; H03B 5/32
See application file for complete search history.

(56) References Cited

U.S. PATENT DOCUMENTS

| | | | |
|---|---|---|---|
| 4,293,986 A | 10/1981 | Kobayashi et al. | |
| 6,518,688 B1 * | 2/2003 | Sasaki ...................... | H03H 9/56 310/366 |
| 9,093,634 B2 | 7/2015 | Il et al. | |
| 2012/0133248 A1 * | 5/2012 | Kusano ................ | H03H 9/0547 310/348 |

FOREIGN PATENT DOCUMENTS

| | | |
|---|---|---|
| CN | 204392206 | 6/2015 |
| CN | 211457100 | 9/2020 |
| CN | 111988009 | 11/2020 |
| CN | 112087210 | 12/2020 |
| JP | 2014192892 | 10/2014 |
| JP | 2019068304 | 4/2019 |
| JP | 2019211229 | 12/2019 |
| JP | 2020010012 | 1/2020 |
| TW | 202333450 | 8/2023 |

OTHER PUBLICATIONS

"Office Action of Taiwan Counterpart Application", issued on May 22, 2025, p. 1-p. 8.
"Office Action of Japan Counterpart Application", issued on Jun. 30, 2025, p. 1-p. 2.

* cited by examiner

*Primary Examiner* — Jeffrey M Shin
(74) *Attorney, Agent, or Firm* — JCIPRNET

(57)　　　　　ABSTRACT

A quartz resonator including a casing, a pad, an oscillator crystal and a thermistor is provided. The casing includes a first casing and a second casing. The pad is disposed on an outer surface of the second casing. The oscillator crystal includes two thick parts and a thin part whose two ends are respectively connected to the two thick parts. The two thick parts are sandwiched between the first casing and the second casing. An inner surface of the first casing and the thin part of the oscillator crystal form a sealed first space, and an inner surface of the second casing and the thin part of the oscillator crystal form a sealed second space. The thermistor is disposed in the first space or the second space and is electrically connected to the pad.

9 Claims, 4 Drawing Sheets

QUARTZ RESONATOR

CROSS-REFERENCE TO RELATED APPLICATION

This application claims the priority benefit of Taiwan application serial no. 113139207, filed on Oct. 15, 2024. The entirety of the above-mentioned patent application is hereby incorporated by reference herein and made a part of this specification.

BACKGROUND

Technical Field

The disclosure relates to a resonator, and particularly relates to a quartz resonator.

Description of Related Art

The modern resonator includes a casing, an oscillator crystal, and a thermistor. The oscillator crystal is disposed in the casing, and the thermistor is disposed outside the casing, which prevents the thermistor from precisely measuring the temperature of the oscillator crystal, and also results in an excessively large volume of the resonator.

SUMMARY

The present invention provides a quartz resonator, capable of precisely measuring temperature.

The quartz resonator of the present invention includes a casing, a pad, an oscillator crystal, and a thermistor. The casing includes a first casing and a second casing. The pad is disposed on an outer surface of the second casing. The oscillator crystal includes two thick parts and a thin part, the two ends of the thin part connect to the two thick parts. The two thick parts are clamped between the first casing and second casing. An inner surface of the first casing and the thin part of the oscillator crystal form a sealed first space, and an inner surface of the second casing and the thin part of the oscillator crystal form a sealed second space. The thermistor is disposed in the first space or the second space and is electrically connected to the pad.

Based on the above, the thermistor of the quartz resonator of the disclosure is disposed in the casing, and is closer to the oscillator crystal in the casing, thereby precisely measuring the temperature of the oscillator crystal. The thermistor disposed in the casing may also reduce a volume of the quartz resonator.

DESCRIPTION OF THE EMBODIMENTS

Figure 1:
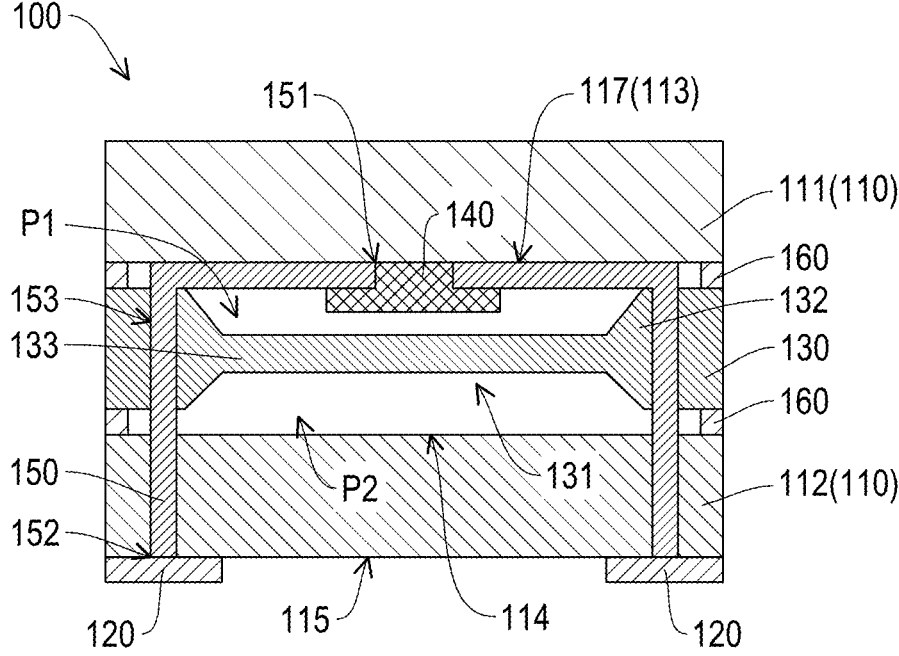
FIG. 1 is a schematic diagram of a quartz resonator according to an embodiment of the disclosure.

FIG. 1 is a schematic diagram of a quartz resonator according to an embodiment of the disclosure. Referring to FIG. 1, the quartz resonator 100 includes a casing 110, a pad 120, an oscillator crystal 130, and a thermistor 140. The casing 110 includes a first casing 111 and a second casing 112. The pad 120 is disposed on an outer surface 115 of the second casing 112. The oscillator crystal 130 includes two thick parts 132 and a thin part 133, two ends of the thin part 133 connect to the two thick parts 132 respectively. The two thick parts 132 are clamped between the first casing 111 and the second casing 112.

An inner surface 113 of the first casing 111 and the thin part 133 of the oscillator crystal 130 form a sealed first space P1, and an inner surface 114 of the second casing 112 and the thin part 133 of the oscillator crystal 130 form a sealed second space P2. The inner surface 114 of the second casing 112 corresponds to the outer surface 115. The thermistor 140 is disposed in the first space P1 or the second space P2 and is electrically connected to the pad 120. The pad 120 is located outside the second space P2.

Since the thermistor 140 is disposed inside the casing 110 and closer to the oscillator crystal 130, thereby the thermistor 140 may more precisely measure the temperature of the oscillator crystal 130. The thermistor 140 may be, for example, the thin-film thermistor 140, which may reduce the volume of the quartz resonator 100. The number of pads 120 may be two, for instance, but not limited thereto.

The quartz resonator 100 further includes a circuit structure 150, two ends 151, 152 of the circuit structure 150 connect to the pad 120 and the thermistor 140 respectively. The circuit structure 150 passes through a part of the casing 110. The thermistor 140 is electrically connected to the pad 120 through the circuit structure 150. In this embodiment, the thermistor 140 is disposed inside the first space P1, and is located between the first casing 111 and the oscillator crystal 130. The casing 110 includes an internal flat surface 117. Here, the internal flat surface 117 is the inner surface 113 of the first casing 111. The thermistor 140 is disposed on the internal flat surface 117 (the inner surface 113) of the first casing 111 and faces the oscillator crystal 130. The thermistor 140 is closer to the oscillator crystal 130 and more accurately measures the temperature of the oscillator crystal 130. A middle section 153 between the two ends 151, 152 of the circuit structure 150 passes through at least one of the two thick parts 132 of the oscillator crystal 130 and the second casing 112. In this embodiment, the middle section 153 passes through the two thick parts 132.

A groove 131 is formed between the two thick parts 132 and the thin part 133 of the oscillator crystal 130 form, and the oscillator crystal 130 forms a necking structure. The thermistor 140 corresponds to the groove 131. A material of the casing 110 and a material of the oscillator crystal 130 are quartz, thereby the packaging casing (the casing 110) and the oscillator crystal 130 may have the same expansion coefficient.

In modern quartz resonator, the packaging casing and the oscillator crystal are made of different materials, thus the packaging casing and the oscillator crystal have the different expansion coefficients. This causes the inconsistent frequency changes between the packaging casing and the oscillator crystal during the temperature regulation processes in modern quartz resonator, resulting in the hysteresis and thereby affecting the accuracy of the modern quartz resonator. In this embodiment, since the casing 110 and the oscillator crystal 130 of the quartz resonator 100 have the same expansion coefficient (i.e., the same material), the frequency changes of the casing 110 and the oscillator crystal 130 are consistent during the temperature regulation processes, thereby the quartz resonator 100 has better accuracy.

In addition, the quartz resonator 100 further includes two mounting rings 160. One of the mounting ring 160 is disposed between the first casing 111 and the two thick parts 132 of the oscillator crystal 130, and the other of the mounting ring 160 is disposed between the second casing 112 and the two thick parts 132 of the oscillator crystal 130, thereby sealing the casing 110 and the oscillator crystal 130.

Figure 2:
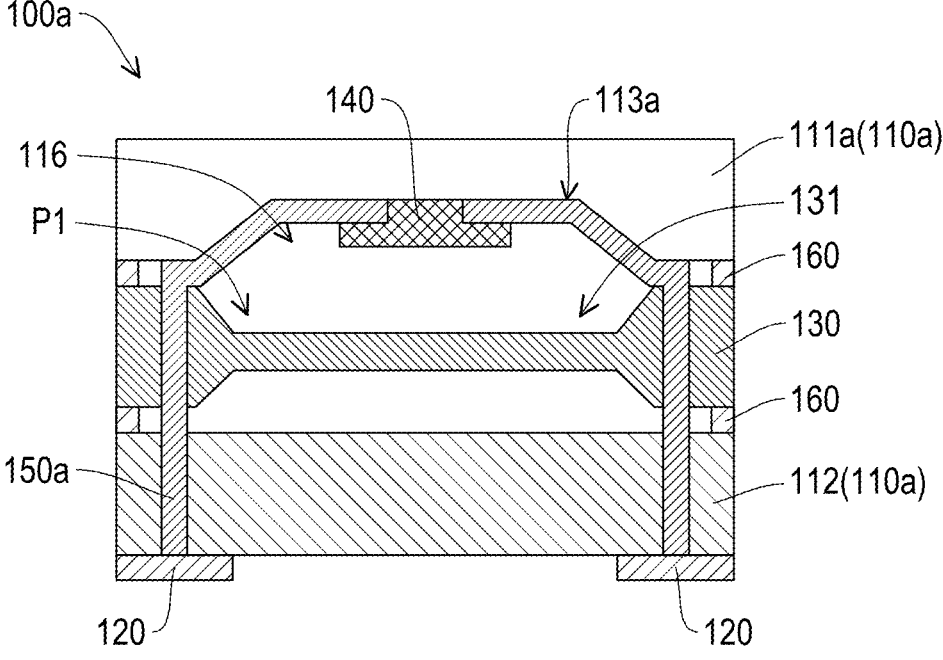
FIG. 2 is a schematic diagram of a quartz resonator according to another embodiment of the disclosure.

FIG. 2 is a schematic diagram of a quartz resonator according to another embodiment of the disclosure. Referring to FIG. 1 and FIG. 2 at the same time, the quartz resonator 100*a* of this embodiment is similar to the previous embodiment. The difference between the two is that the inner surface 113*a* of the first casing 111*a* in this embodiment includes a slot 116 that is recessed towards the interior of the first casing 111*a* in a direction away from the oscillator crystal 130. The thermistor 140 is disposed in the slot 116. By means of the slot 116, the casing 110*a* has a larger space to facilitate the engineers in assembling the quartz resonator 100*a*. The circuit structure 150*a* located in the first space P1 extends along the surface of the slot 116 and connects to the thermistor 140. The quartz resonator 100*a* of this embodiment has the same effect as the previous embodiment, and is not repeated herein.

Figure 3:
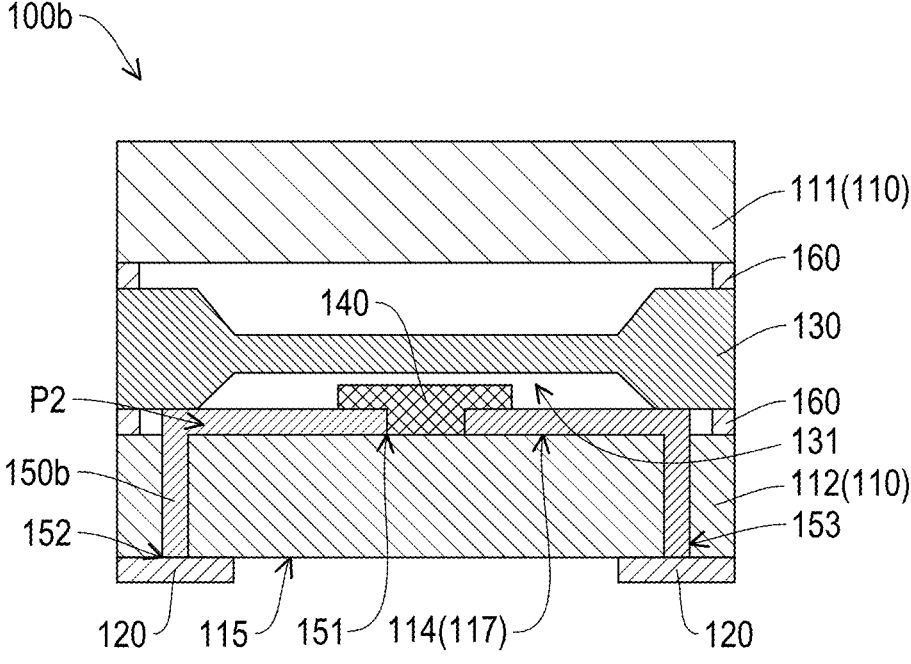
FIG. 3 is a schematic diagram of a quartz resonator according to another embodiment of the disclosure.

FIG. 3 is a schematic diagram of a quartz resonator according to another embodiment of the disclosure. Referring to FIG. 1 and FIG. 3 at the same time, the quartz resonator 100*b* of this embodiment is similar to the previous embodiment. The difference between the two is that the thermistor 140 in this embodiment is disposed in the second space P2. Here, the internal flat surface 117 of the casing 110 is the inner surface 114 of the second casing 112. The thermistor 140 is disposed on the inner surface 114 (the internal flat surface 117) of the second casing 112. The middle section 153 between the two ends 151, 152 of the circuit structure 150*b* only passes through the second casing 112. The quartz resonator 100*b* of this embodiment has the same effect as the previous embodiment, and is not repeated herein.

Figure 4:
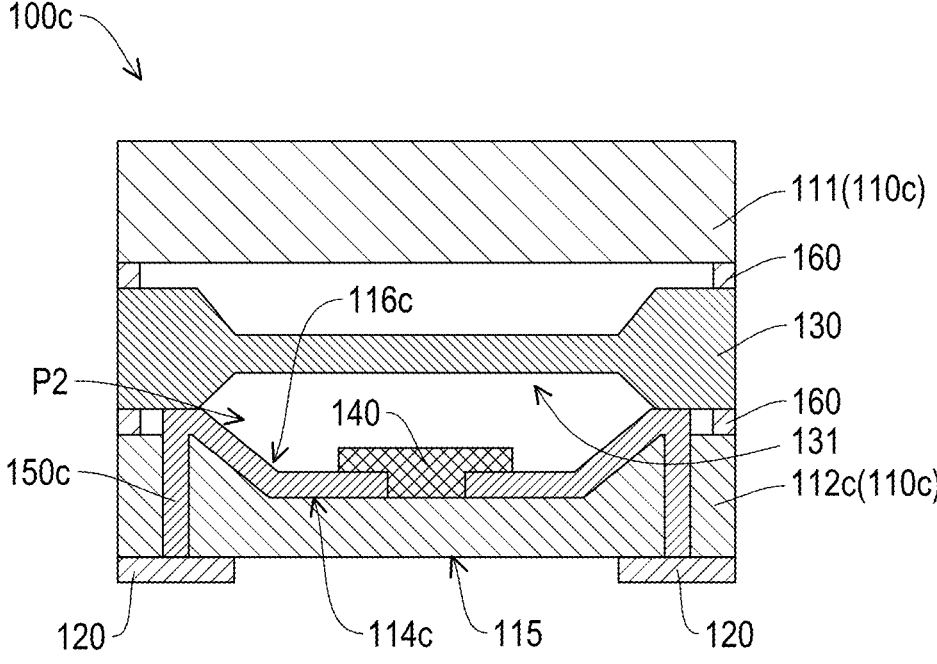
FIG. 4 is a schematic diagram of a quartz resonator according to another embodiment of the disclosure.

FIG. 4 is a schematic diagram of a quartz resonator according to another embodiment of the disclosure. Referring to FIG. 3 and FIG. 4 at the same time, the quartz resonator 100*c* of this embodiment is similar to the previous embodiment. The difference between the two is that the inner surface 114*c* of the second casing 112*c* in this embodiment includes a slot 116*c* recessed towards the interior of the second casing 112*c* in the direction away from the oscillator crystal 130. The thermistor 140 is disposed in the slot 116*c*. The circuit structure 150*c* located in the second space P2 extends along the surface of the slot 116*c* and connects to the thermistor 140. The quartz resonator 100*c* of this embodiment has the same effect as the previous embodiment, and is not repeated herein.

In summary, the thermistor of the quartz resonator of the disclosure is disposed in the casing, and is closer to the oscillator crystal in the casing, thereby precisely measuring the temperature of the oscillator crystal. The thermistor disposed in the casing may also reduce a volume of the quartz resonator.

What is claimed is:

1. A quartz resonator, comprising:
a casing, comprising a first casing and a second casing;
a pad, disposed on an outer surface of the second casing;
an oscillator crystal, comprising two thick parts and a thin part, two ends of the thin part connect the two thick parts, the two thick parts are clamped between the first casing and the second casing, an inner surface of the first casing and the thin part of the oscillator crystal form a sealed first space, an inner surface of the second casing and the thin part of the oscillator crystal form a sealed second space;
a thermistor, disposed in the first space or the second space and electrically connected to the pad; and
a circuit structure, with two ends of the circuit structure respectively connected to the pad and the thermistor, the circuit structure passes through the second casing.

2. The quartz resonator according to claim 1, wherein the thermistor is disposed within the first space, and the circuit structure passes through the least one of the two thick parts of the oscillator crystal.

3. The quartz resonator according to claim 2, wherein the thermistor is disposed on the inner surface of the first casing.

4. The quartz resonator according to claim 3, wherein the inner surface of the first casing comprises a slot recessed towards an interior of the first casing in a direction away from the oscillator crystal, and the thermistor is disposed within the slot.

5. The quartz resonator according to claim 1, wherein the thermistor is disposed within the second space.

6. The quartz resonator according to claim 5, wherein the thermistor is disposed on the inner surface of the second casing.

7. The quartz resonator according to claim 6, wherein the inner surface of the second casing comprises a slot recessed towards an interior of the second casing in a direction away from the direction of the oscillator crystal, and the thermistor is disposed within the slot.

8. The quartz resonator according to claim 1, wherein a material of the casing and a material of the oscillator crystal are quartz.

9. The quartz resonator according to claim 1, further comprises two mounting rings, one of the two mounting rings is disposed between the first casing and the two thick parts of the oscillator crystal, the other of the two mounting rings is disposed between the second casing and the two thick parts of the oscillator crystal.

* * * * *